(12) United States Patent
Takasu

(10) Patent No.: US 7,887,688 B2
(45) Date of Patent: Feb. 15, 2011

(54) PROCESS FOR PRODUCING ELECTRONIC CIRCUIT

(75) Inventor: Isao Takasu, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1233 days.

(21) Appl. No.: 11/497,045

(22) Filed: Aug. 1, 2006

(65) Prior Publication Data

US 2007/0181429 A1   Aug. 9, 2007

(30) Foreign Application Priority Data

Aug. 2, 2005   (JP) .............................. 2005-223900

(51) Int. Cl.
  *C25D 13/12*   (2006.01)
  *C25D 13/16*   (2006.01)
(52) U.S. Cl. .................. 204/486; 204/490; 204/512
(58) Field of Classification Search ................ 204/486, 204/490, 512
See application file for complete search history.

(56) References Cited

FOREIGN PATENT DOCUMENTS

| JP | 4-319961 | * 11/1992 |
|---|---|---|
| JP | 2004-048030 | 2/2004 |

* cited by examiner

*Primary Examiner*—Kishor Mayekar
(74) *Attorney, Agent, or Firm*—Turocy & Watson, LLP

(57) ABSTRACT

Disclosed is a production process of an electronic circuit that can efficiently form a highly accurate electrically conductive pattern. The production process comprises the steps of: adhering insulating particles onto an electrically conductive base material to form an insulating pattern comprising a pattern region and a nonpattern region on the electrically conductive base material; adhering electrically conductive particles to the nonpattern region by first electrophoretic treatment; removing the pattern region by second electrophoretic treatment; and transferring the electrically conductive particles onto a recording medium to form an electrically conductive pattern of the electrically conductive particles onto the recording medium.

8 Claims, 2 Drawing Sheets

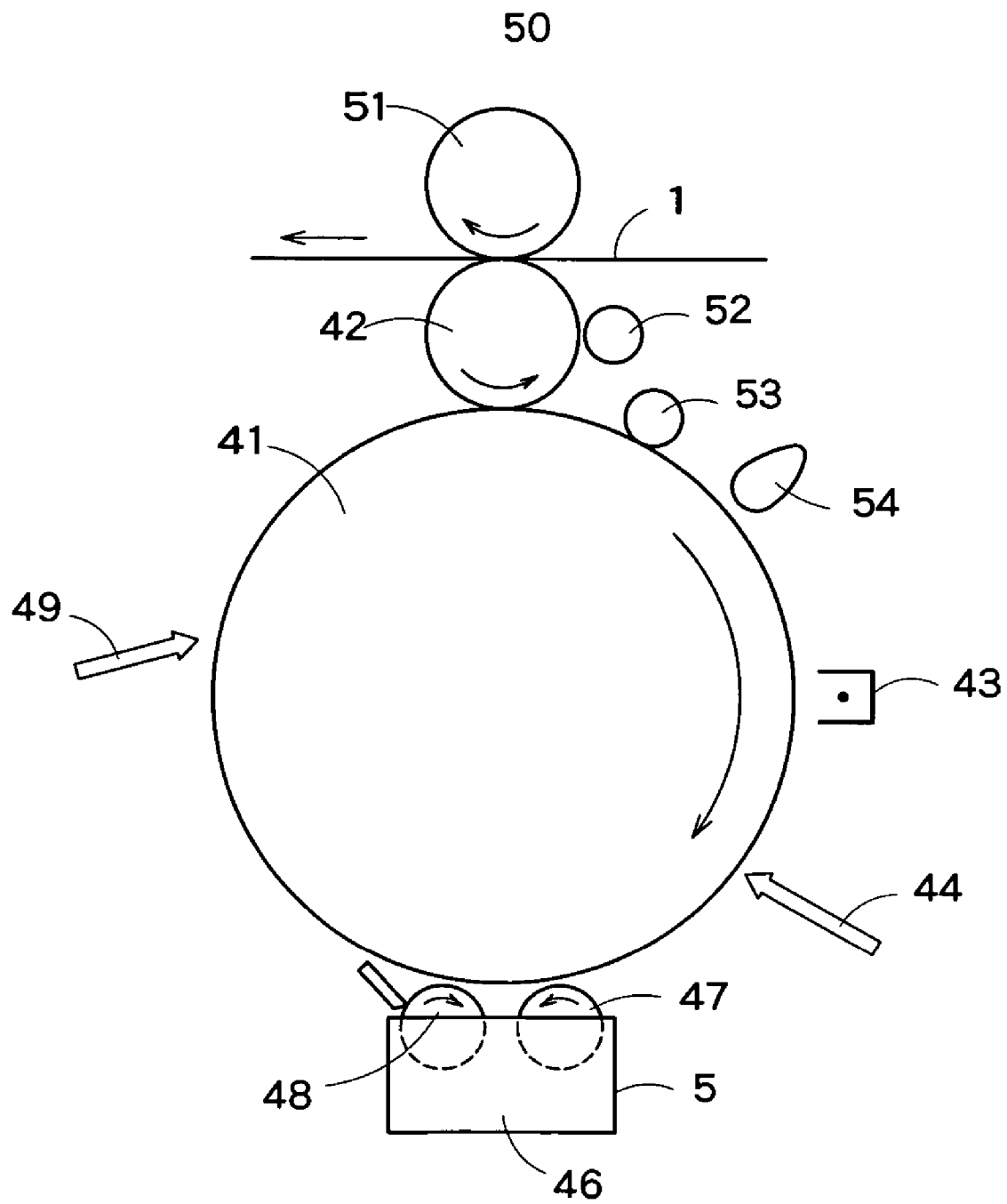
F I G. 3

PROCESS FOR PRODUCING ELECTRONIC CIRCUIT

BACKGROUND OF THE INVENTION

1. Field of Invention

The present invention relates to a process for producing an electronic circuit. More particularly, the present invention relates to a process for producing an electronic circuit by utilizing an electrophoretic treatment technique. The production process of an electronic circuit according to the present invention can be regarded as a production process of an electrically conductive pattern or a method for electrically conductive pattern formation.

2. Background Art

Various methods have hitherto been proposed for the production of electronic circuits. An example of a widely adopted method comprises providing a mask layer corresponding to an electronic circuit pattern, for example, on an electrically conductive surface of a substrate, subjecting the assembly to etching treatment to remove the electrically conductive layer on the substrate, and then separating the mask layer to form an electrically conductive pattern on the substrate.

Another example of the method for electrically conductive pattern formation is a method in which electrophotography has been applied. The electrophotography is a method in which a photoreceptor is evenly electrified, for example, by corona discharge under light shielding conditions, light is applied by a laser or an LED light source to allow charges to disappear and thus to form a desired charge pattern, and adhering, by electrostatic force, toner particles electrified based on this pattern to form a pattern on the surface of an electrically conductive substrate.

In this method utilizing the electrophotography, the use of electrically conductive particles, for example, metal particles, as toner particles can also realize the formation of a wiring pattern by simple optical writing. The use of such metal particles is disadvantageous in that, upon contact with a roller, which is unavoidably used in an electrophotographic treatment process, for example, with a development roller for the application of a development voltage, a latent image formed on the photoreceptor is sometimes broken. Accordingly, this method is not always suitable for the formation of an electrically conductive pattern with high accuracy.

To overcome this problem, Japanese Patent Laid-Open No. 48030/2004 discloses a method for electrically conductive pattern formation has been proposed which comprises forming a pattern using toner particles into which a minimized amount of metal particles have been mixed (development), and finally conducting plating treatment along this pattern using the metal particles as a core to form an electrically conductive pattern.

SUMMARY OF THE INVENTION

The above method is innovative as a method for electrically conductive pattern formation by electrophotography. In this method, the development process by toner particles can be carried out at a high speed. However, a lot of time is necessary for the plating process, and, thus, it can be said that the advantage of the efficiency of the electrophotography is not satisfactorily utilized.

An object of the present invention is to provide a process for producing an electronic circuit that can efficiently produce an electrically conductive pattern with high accuracy.

Thus, according to the present invention, there is provided a process for producing an electronic circuit, comprising the steps of:

adhering insulating particles onto an electrically conductive base material to form an insulating pattern comprising a pattern region and a nonpattern region on said electrically conductive base material;

adhering electrically conductive particles to said nonpattern region by first electrophoretic treatment;

removing said pattern region by second electrophoretic treatment; and transferring said electrically conductive particles onto a recording medium to form an electrically conductive pattern of the electrically conductive particles onto the recording medium.

The present invention can provide a process for producing an electronic circuit that can efficiently produce an electrically conductive pattern with high accuracy.

BRIEF DESCRIPTION OF THE DRAWINGS

FIG. 3 is a schematic diagram showing an electrophotographic apparatus used in the present invention.

BEST MODE FOR CARRYING OUT THE INVENTION

Figure 1:
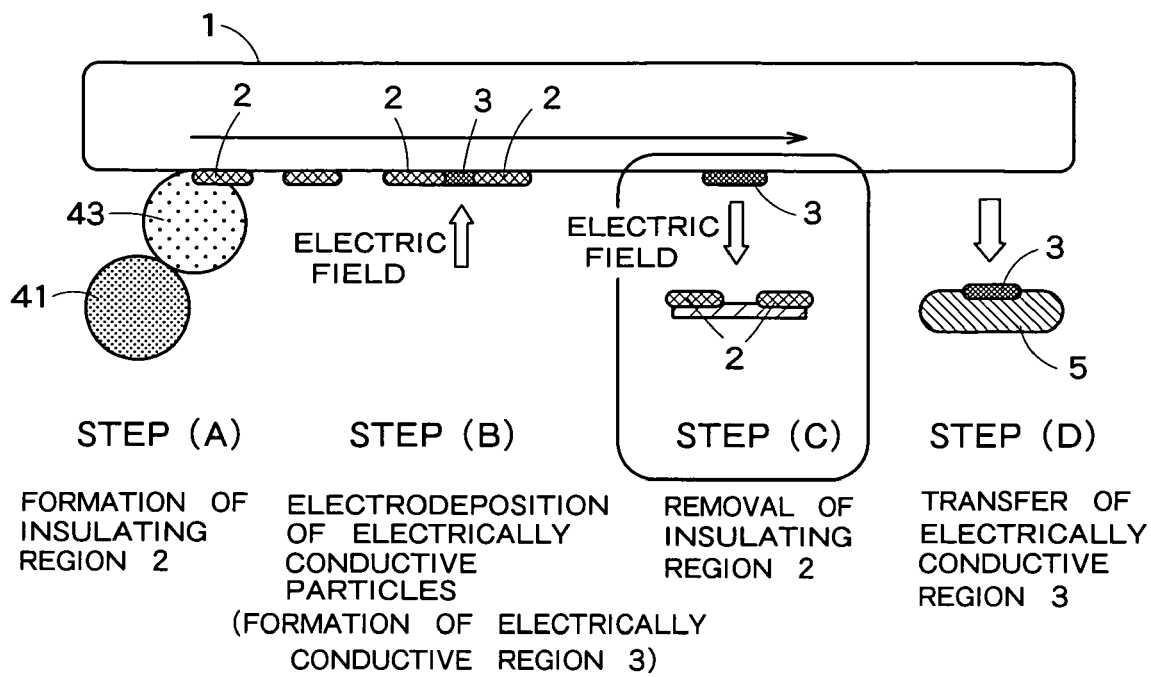
FIG. 1 is a schematic diagram illustrating a process according to the present invention.

Each step in the production process of an electronic circuit according to the present invention is generally as shown in FIG. 1.

Figure 2:
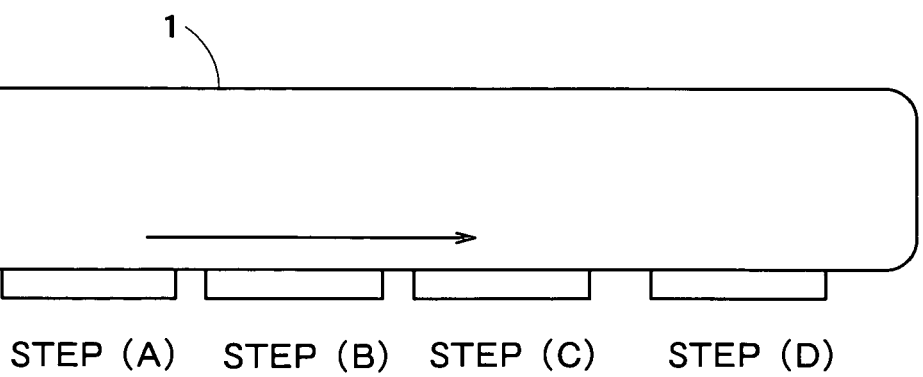
FIG. 2 is a schematic diagram illustrating a process according to the present invention.

In FIG. 1, numeral 1 designates an electrically conductive base material. This electrically conductive base material 1 is being moved in a direction indicated by an arrow in FIG. 1, and, in the course of movement, steps (A) to (D) in the process according to the present invention are successively carried out. FIG. 1 shows an embodiment in which a belt-shaped material being moved in the direction indicated by the arrow per se is used as the electrically conductive base material 1. FIG. 2 shows an embodiment in which a plurality of electrically conductive base materials 1 are moved by a belt-shaped material in a direction indicated by an arrow.

<Step of Adhering Insulating Particles on Electrically Conductive Base Material to Form Insulating Pattern Comprising Pattern Region and Nonpattern Region on the Electrically Conductive Base Material (Step(A))>

In the process for producing an electronic circuit according to the present invention, at the outset, an insulating pattern comprising a pattern region 2 and a nonpattern region 3 are formed by adhering insulating particles on the electrically conductive base material 1. The term "pattern region" as used herein refers to an insulating particle pattern region formed of adhered insulating particles. The term "nonpattern region" as used herein refers to a region where insulating particles have not been adhered. Further, the term "insulating pattern" refers to an insulating pattern formed by the above "pattern region."

Any electrically conductive base material may be used as the electrically conductive base material 1. In the present invention, for example, the use of a strong metal such as stainless steel is preferred. This thickness of the electrically conductive base material 1 is preferably not more than 0.1 mm.

The electrically conductive base material 1 preferably has an electrically conductive easy-separation treated surface.

When the surface of the electrically conductive base material 1 has an electrically conductive easy-separation treated surface, the removal of the pattern region 2 carried out in step (C) and the transfer of electrically conductive particles onto a recoring medium carried out in step (D) can be carried out more easily and completely. Fluororesin treatment may be mentioned as a specific preferred example of the easy-separation treatment. In the present invention, a fluororesin-containing plating treatment method comprising forming a metal plating layer with fluororesin particles (preferably having an average diameter of about one micron) dispersed therein is particularly preferred. In this case, nickel is typical and preferred as the metal in the metal plating. This fluororesin-containing plating treatment simultaneously imparts both electric conductivity by the metal (preferably nickel) and releasability by the fluororesin to the surface of the electrically conductive base material 1.

Resin particles such as acrylic polymers or oxide particles may be used as the insulating particles in this step. Particularly preferred are inorganic particles such as silicon dioxide ($SiO_2$), aluminum oxide ($Al_2O_3$), and ceramic particles. The particulate material may be specifically selected according to details of first electrophoretic treatment in the next step. For example, in the first electrophoretic treatment, a nonpolar or weakly polar solvent (for example, a hydrocarbon solvent) is used, since resin particles as an insulating film does not dissolve, resin particles can be used as the insulating pattern. On the other hand, particularly when a strong polar solvent such as toluene or acetone is used, the resin particles as the insulating film are dissolved. Therefore, in this case, inorganic insulating particles are preferably used.

As described above, preferably, this step may be carried out by electrophotography in which an insulating toner is adhered onto an electrically conductive base material, particularly preferably by wet electrophotography in which a liquid toner is used as the above insulating toner. In the wet electrophotography using a liquid toner, a fine toner of a submicron size which cannot be realized by the dry type can be used. Further, for example, for the reason that the scattering of the toner particles is not significant, advantageously, higher-definition patterning can be realized. The liquid toner is a toner prepared by dispersing a pigment component-containing toner particles having a diameter of not more than about 2 μm in a carrier liquid such as an insulating hydrocarbon solvent.

FIG. 3 shows one embodiment of an electrophotographic apparatus that conducts such electrophotography. A photoreceptor 41 and an intermediate transfer medium 42 as a principal part of the electrophotographic apparatus are also shown in FIG. 1.

In FIG. 3, the photoreceptor 41 functions as a latent image holding medium and is a photoreceptor drum comprising an organic or amorphous silicon photosensitive layer provided on an electrically conductive substrate. This photoreceptor 41 is evenly electrified by a well known electrifier 43 (for example, a corona electrifier or a scorotron electrifier) and is then exposed to an image modulated laser beam 44 to form an electrostatic latent image on the surface of the photoreceptor 41. Thereafter, the electrostatic latent image is visualized by a developing device 45 containing a liquid developing agent. The developing device 45 comprises a vessel containing a liquid toner 46, a developing roller 47, and a squeeze roller 48. The liquid toner 46 is fed by a developing roller 47 to the electrostatic latent image formed on the photoreceptor 41, and, further, excess liquid toner is squeezed out by the squeeze roller 48 to develop the electrostatic latent image. The liquid toner image adhered onto the electrostatic latent image is subjected to whole image exposure by an eraser lamp 49 constituted, for example, by LED to erase excess charges, and the step is then transferred to the step of transfer where the image is transferred onto the electrically conductive base material 1 by a transfer device 50 comprising an intermediate transfer medium 42 and a pressure roller 51. In this case, a method may also be adopted in which, without the use of the intermediate transfer medium 42 in the transfer device 50, the electrically conductive base material 1 is passed through between the photoreceptor 41 and the pressure roller 51 to transfer the image from the photoreceptor 41 directly onto the electrically conductive base material 1. Alternatively, as exemplified in FIG. 3, the image may be transferred onto the electrically conductive base material 1 through the intermediate transfer medium 42. Either transfer by an electric field or transfer by pressure (and heat) may be used in the transfer from the photoreceptor 41 onto the electrically conductive base material 1, the transfer from the photoreceptor 41 onto the intermediate transfer medium 42, and the transfer from the intermediate transfer medium 42 onto the electrically conductive base material 1. In this case, when a heated pressure roller 51 is used, the liquid toner 46 is fixed onto the electrically conductive base material 1 by the action of heat and pressure. Numeral 52 designates a cleaner for the intermediate medium, numeral 53 a cleaner, and numeral 54 a neutralization lamp.

<Step of Adhering Electrically Conductive Particles onto Nonpattern Region by First Electrophoretic Treatment (Step (B))>

Electrically conductive particles are adhered by the first electrophoretic treatment onto the nonpattern region 3 on the electrically conductive base material 1 with the insulating pattern 2 formed thereon. The electrically conductive particles are not substantially adhered by the first electrophoretic treatment onto the pattern region 2 on the electrically conductive base material 1. Accordingly, in this step, the electrically conductive particles are selectively adhered onto the nonpattern region 3 on the electrically conductive base material 1.

The first electrophoretic treatment is treatment for adhering electrically conductive particles onto the nonpattern region 3 on the electrically conductive base material 1 as described above. Specifically, the first electrophoretic treatment comprises, in a dispersion medium with electrically conductive particles dispersed or suspended therein, adhering the above electrically conductive particles onto the pattern region 3 in the electrically conductive base material 1 through the action of an electric field.

Electrically conductive particles usable in the first electrophoretic treatment include various metal particles, metal oxide particles, and electrically conductive polymer material particles. Electrically conductive particles which are particularly preferred in the present invention include particles of metals such as silver (Ag), palladium (Pd), silver palladium (AgPd), platinum (Pt), gold (Au), nickel (Ni), copper (Cu), aluminum (Al), and rhodium (Rh), particles of metal oxides such as copper oxide (CuO), zinc oxide (ZnO), tin oxide ($SnO_2$), and titanium oxide ($TiO_2$), and particles of electrically conductive polymer materials such as polyacetylene, polyacene, polyazyl, polypyrrole, polyaniline, and polyphenylenevinylene.

The particle diameter of the electrically conductive particles is suitably 10 nm to 5 μm. When the particle diameter exceeds 5 μm, it is difficult to provide satisfactory resolution. Preferred dispersion media usable in the first electrophoretic treatment include toluene, acetone, methanol, alcohol, isopropyl alcohol, and hydrocarbon solvents. In dispersing the electrically conductive polymer in the dispersion medium, the use of a dispersant such as soybean lecithin is preferred.

When the electrically conductive particles are dispersed in the dispersion medium, the electrically conductive particles are generally electrified, for example, by a mechanism of adherence of protons in a solvent. In this state, when an electric field occurs between electrodes, the electrically conductive particles are moved toward one of the electrodes by the action of the charges and are adhered onto the electrode to form an electrically conductive film. In the first electrophoretic treatment according to the present invention, electrophoretic treatment is carried out by utilizing the electrically conductive base material 1 as one of the electrodes. The electrically conductive particles, upon contact with the electrode (electrically conductive base material 1), lose the charges. Accordingly, the electrically conductive particles are adhered, in a substantially neutralized state, in a layer form on the electrically conductive base material 1.

The first elctrophoretic treatment is preferably carried out in an electric field in which the applied voltage is not less than 100 V/m and not more than 1000 V/m. In general, the lower the applied voltage, the closer the deposited state of the electrically conductive particles. In this case, however, the time necessary for the treatment is likely to be longer.

<Step of Removing Pattern Region by Second Electrophoretic Treatment (Step (C))>

The electrically conductive base material 1 in its pattern region 2 with electrically conductive particles adhered thereon is removed by second electrophoretic treatment from the upper part of the electrically conductive base material 1. It is important that the electrophoretic treatment be carried out in an electric field which is opposite to an electric field, in which the first electrophoretic treatment is carried out, for removing the pattern region 2 on the electrically conductive material 1.

The second electrophoretic treatment may be carried out in the same dispersion medium as in the first electrophoretic treatment. In particular, when the pattern region 2 to be removed has been formed by a liquid toner, the dispersion medium used in this second electrophoretic treatment is preferably a dispersion medium used as a carrier liquid in the liquid toner. If necessary, a dispersant such as soap may be added to the dispersion medium.

The second electrophoretic treatment may be carried out in which the applied voltage is not less than 100 V/m and not more than 1000 V/m. Preferably, however, the second electrophoretic treatment is carried out in an electric field which is higher in applied voltage than the electric field in which the first electrophoretic treatment is carried out. According to this construction, the insulating region 2 can be removed more reliably.

As described above, the electrically conductive particles adhered onto the electrically conductive base material 1 in step (B) are in a neutralized state due to the loss of the charges and, further, are electrically connected to the electrode. Therefore, in the second electrophoretic treatment, the electrification of the electrically conductive particles adhered onto the electrically conductive base material 1 is suppressed. Accordingly, the pattern region 2 on the electrically conductive base material 1, even when subjected to the second electrophoretic treatment, is not separated, whereby, in the second electrophoretic treatment, only the pattern region 2 on the electrically conductive base material 1 is selectively separated.

When the surface of the electrically conductive base material 1 is an electrically conductive easy-separation treated surface, the pattern region 2 can be removed more easily and completely.

<Step of Transferring Electrically Conductive Particles onto Recording Medium to Form Electrically Conductive Pattern of Electrically Conductive Particles on the Recording Medium (Step (D))>

Next, the electrically conductive base material 1 from which the pattern region 3 has been removed, is then transferred to the step of transferring the electrically conductive particles, adhered onto the electrically conductive base material 1, onto a recording medium 5 to form an electrically conductive pattern of the electrically conductive particles on the recording medium (step (D)).

The electrically conductive pattern formed on the recording medium can be utilized as a wiring pattern of an electronic circuit either as such or optionally, for example, after subjected to fixation treatment by heat or the like. The recording medium on its side where the electrically conductive particles are to be transferred, is preferably tacky.

The electrically conductive base material 1 from which the electrically conductive particles have been removed in this step, can be reutilized as the electrically conductive base material 1 in step (A) either as such or optionally after subjected to additional other treatment(s).

As described above, according to the present invention, a fine electrically conductive metal pattern can be formed very simply and efficiently by virtue of the adoption of electrophoretic treatment in the step of adhering electrically conductive particles onto a nonpattern region on an electrically conductive base material, and the adoption of electrophoretic treatment in the step of removing a pattern region on the electrically conductive base material.

Since the step of forming an insulating pattern on an electrically conductive base material can be carried out by electrophotography, the formation of the pattern region is very simple and efficient. As compared with the conventional so-called photoetching, in many cases, the electrophotography is generally advantageous, for example, in equipment, cost, and process time and is suitable particularly for the production of electronic circuits in small or medium numbers. Therefore, the effect of the present invention is significant in rapid production of a wide variety of electronic circuits.

Further, the electrically conductive base material for use in adherence of insulating particles are passed through subsequent steps and are finally brought to such a state that both the insulating particles and electrically conductive particles have been removed. Therefore, this electrically conductive base material can be reutilized as an electrically conductive base material either as such or optionally after subjected to additional other treatment(s). This is advantageous in cost.

Further, unlike the conventional process, etching treatment of the electrically conductive metal is unnecessary and, further, the plating treatment is unnecessary. The process of the present inventions has no significant influence on environment and the like.

The invention claimed is:

1. A process for producing an electronic circuit, comprising the steps of:
    adhering insulating particles onto an electrically conductive base material to form an insulating pattern comprising a pattern region and a nonpattern region on said electrically conductive base material;
    adhering electrically conductive particles to said nonpattern region by first electrophoretic treatment;

removing said pattern region by second electrophoretic treatment; and transferring said electrically conductive particles onto a recording medium to form an electrically conductive pattern of the electrically conductive particles onto the recording medium.

2. The process for producing an electronic circuit according to claim 1, wherein said insulating particles are insulating toners, being adhered onto said electrically conductive base material using an electrophotographic method.

3. The process for producing an electronic circuit according to claim 1, wherein said second electrophoretic treatment is carried out in an electric field which is opposite to an electric field in which said first electrophoretic treatment is carried out, and is higher in applied voltage than the electric field in which said first electrophoretic treatment is carried out.

4. The process for producing an electronic circuit according to claim 1, wherein said second electrophoretic treatment is carried out in an electric field in which the applied voltage is not less than 100 V/m and not more than 1000 V/m.

5. The process for producing an electronic circuit according to claim 1, wherein said electrically conductive particles are formed of a metal, a metal oxide, or a polymer compound.

6. The process for producing an electronic circuit according to claim 5, wherein said electrically conductive particles are formed of silver, palladium, platinum, gold, nickel, copper, aluminum, or rhodium either as a simple substance or as an alloy thereof.

7. The process for producing an electronic circuit according to claim 1, wherein said insulating particles have a particle diameter of 0.1 to 5.0 µm.

8. The process for producing an electronic circuit according to claim 1, wherein a surface of said electrically conductive base material is an electrically conductive surface subjected to easy-separation treatment.

* * * * *